(12) United States Patent
Yokota

(10) Patent No.: US 9,887,085 B2
(45) Date of Patent: Feb. 6, 2018

(54) SEMICONDUCTOR DEVICE AND METHOD FOR MANUFACTURING THE SAME

(71) Applicant: Renesas Electronics Corporation, Tokyo (JP)

(72) Inventor: Kazuki Yokota, Tokyo (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 0 days.

(21) Appl. No.: 15/226,203

(22) Filed: Aug. 2, 2016

(65) Prior Publication Data

US 2017/0040163 A1 Feb. 9, 2017

(30) Foreign Application Priority Data

Aug. 5, 2015 (JP) .................. 2015-155046

(51) Int. Cl.
*H01L 21/027* (2006.01)
*H01L 21/28* (2006.01)
*H01L 29/788* (2006.01)
*H01L 29/66* (2006.01)
*G03F 7/20* (2006.01)
*G03F 7/09* (2006.01)
*H01L 21/3213* (2006.01)
*H01L 27/11521* (2017.01)

(52) U.S. Cl.
CPC .......... *H01L 21/0276* (2013.01); *G03F 7/091* (2013.01); *G03F 7/20* (2013.01); *H01L 21/28273* (2013.01); *H01L 21/32139* (2013.01); *H01L 27/11521* (2013.01); *H01L 29/66825* (2013.01); *H01L 29/7881* (2013.01)

(58) Field of Classification Search
CPC .......... H01L 21/0276; H01L 21/28273; H01L 29/7881; H01L 29/66825; G03F 7/20; G03F 7/091
See application file for complete search history.

(56) References Cited

U.S. PATENT DOCUMENTS

| 6,096,478 A * | 8/2000 | Yamana ............... G03F 7/0045 430/270.1 |
|---|---|---|
| 6,242,160 B1 * | 6/2001 | Fukuzawa ............... G03F 7/091 430/313 |
| 6,255,717 B1 * | 7/2001 | Babcock ........... H01L 21/76232 257/396 |
| 7,070,911 B1 * | 7/2006 | Hopper .................. G03F 7/091 430/14 |
| 8,114,556 B2 * | 2/2012 | Yamada .................. G03F 1/32 430/311 |
| 8,664,012 B2 * | 3/2014 | Gaylord ........... H01L 21/02057 438/5 |
| 2003/0129840 A1 * | 7/2003 | Kumar .............. H01L 21/31116 438/694 |
| 2014/0199628 A1 * | 7/2014 | Edelstein ................ G03F 7/094 430/270.1 |

FOREIGN PATENT DOCUMENTS

JP    11-186137 A    7/1999

* cited by examiner

*Primary Examiner* — Savitr Mulpuri
(74) *Attorney, Agent, or Firm* — Sughrue Mion, PLLC

(57) ABSTRACT

A photoresist is exposed to light under a condition that sensitivity of a second portion of the photoresist on a recessed portion of a base layer is higher than sensitivity of a first portion of the photoresist on a projecting portion of the base layer.

4 Claims, 8 Drawing Sheets

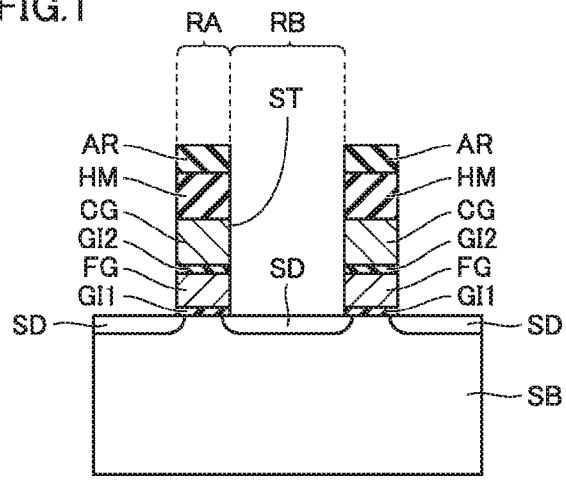
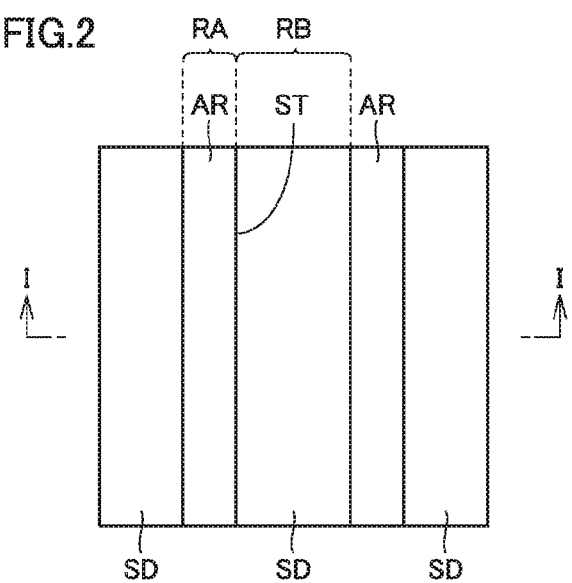
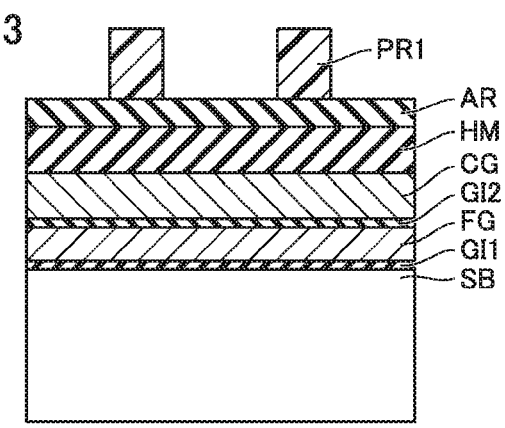

SEMICONDUCTOR DEVICE AND METHOD FOR MANUFACTURING THE SAME

This nonprovisional application is based on Japanese Patent Application No. 2015-155046 filed on Aug. 5, 2015 with the Japan Patent Office, the entire contents of which are hereby incorporated by reference.

BACKGROUND OF THE INVENTION

Field of the Invention

The present invention relates to a semiconductor device and a method for manufacturing the same.

Description of the Background Art

Photolithography is used to form a pattern. In the photolithography, a photoresist is applied onto a film to be processed and thereafter patterned by exposure to light and development. The film to be processed is patterned by performing etching or the like thereon using the patterned photoresist as a mask. Thereafter, the photoresist is removed.

A technique of partially changing the sensitivity of a photoresist used for photolithography is disclosed, for example, in Japanese Patent Laying-Open No. 11-186137.

In this publication, the film thickness of the photoresist at a bottom part of a level difference is selected such that the photoresist has a minimum or minimal sensitivity. This can prevent deterioration in the shape of the photoresist due to halation, according to the above publication.

However, when a film to be processed has a large level difference and a photoresist on the level difference is removed during patterning of the photoresist, a residue of the photoresist is produced at a corner portion of a lower part of the level difference. When the residue of the photoresist is produced, the residue of the photoresist functions as a mask, and the film to be processed directly below the residue of the photoresist cannot be removed by etching or the like. Therefore, it is necessary to remove such a residue of the photoresist.

However, addition of the step of removing the residue of the photoresist increases the number of manufacturing steps. Further, removal of the residue of the photoresist may cause damage to a base layer or adhesion of particles to the base layer. Furthermore, there may be a case where the residue of the photoresist cannot be completely removed.

SUMMARY OF THE INVENTION

Other problems and new features will become apparent from the description of the present specification and the accompanying drawings.

According to one embodiment, a photoresist is exposed to light under a condition that sensitivity of a second portion of the photoresist on a recessed portion of a base layer is higher than sensitivity of a first portion of the photoresist on a projecting portion of the base layer.

According to the one embodiment, a residue of the photoresist is less likely to be produced at the recessed portion of the base layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross sectional view schematically showing a configuration of a portion of a semiconductor device in a first embodiment.

FIG. 2 is a plan view schematically showing the configuration of a portion of the semiconductor device in the first embodiment.

FIG. 3 is a cross sectional view schematically showing a first step of a method for manufacturing the semiconductor device in the first embodiment.

DESCRIPTION OF THE PREFERRED EMBODIMENTS

Figure 4:
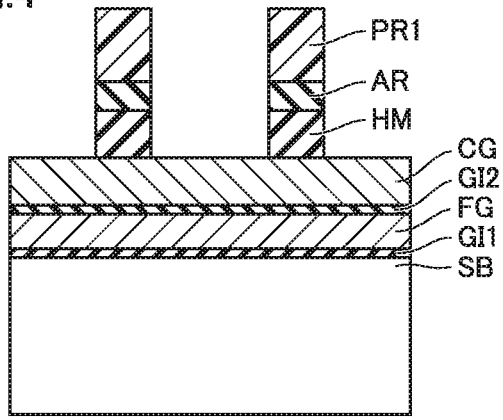
FIG. 4 is a cross sectional view schematically showing a second step of the method for manufacturing the semiconductor device in the first embodiment.

Hereinafter, the present embodiment will be described with reference to the drawings.

First Embodiment

First, as a configuration of a semiconductor device of the present embodiment, a flash memory will be described as an example, with reference to FIGS. 1 and 2. FIG. 1 is a schematic cross sectional view taken along a line I-I in FIG. 2.

As shown in FIG. 1, a plurality of memory cells of a flash memory are formed in a semiconductor substrate SB. One memory cell has one pair of source/drain regions SD, a first gate insulating film GI1, a floating gate electrode FG, a second gate insulating film GI2, and a control gate electrode CG.

Semiconductor substrate SB is made of silicon, for example. This semiconductor substrate SB has a main surface.

One pair of source/drain regions SD is formed in the main surface of semiconductor substrate SB. Each of one pair of source/drain regions SD is formed to be separate from each other. Each of one pair of source/drain regions SD has a conductivity type opposite to the conductivity type of semiconductor substrate SB.

Specifically, each of one pair of source/drain regions SD has an n-type conductivity type when semiconductor substrate SB has a p-type conductivity type. Further, each of one pair of source/drain regions SD has a p-type conductivity type when semiconductor substrate SB has an n-type conductivity type.

First gate insulating film GI1 is formed in contact with the main surface of semiconductor substrate SB. First gate insulating film GI1 is arranged on the main surface of semiconductor substrate SB sandwiched between one pair of source/drain regions SD. First gate insulating film GI1 is made of, for example, a single substance such as a silicon oxide film ($SiO_2$) or a silicon nitride film ($Si_3N_4$), or any combination thereof.

Floating gate electrode FG is arranged on first gate insulating film GI1 in contact with first gate insulating film GI1. Floating gate electrode FG is made of a conductive material. Floating gate electrode FG is made of, for example, polycrystalline silicon doped with an impurity (hereinafter referred to as doped polysilicon).

Second gate insulating film GI2 is arranged on floating gate electrode FG in contact with floating gate electrode FG. Second gate insulating film GI2 is made of, for example, a single substance such as a silicon oxide film or a silicon nitride film, or any combination thereof.

Control gate electrode CG is arranged on second gate insulating film GI2 in contact with second gate insulating film GI2. Control gate electrode CG is made of a conductive material. Control gate electrode CG is made of doped polysilicon, for example.

On control gate electrode CG, a hard mask layer HM is arranged. Hard mask layer HM is patterned and is in contact with control gate electrode CG. Hard mask layer HM is a layer used as a mask when patterning films to be processed, that is, control gate electrode CG and floating gate electrode FG.

Hard mask layer HM is made of a material different from the material for the films to be processed, that is, control gate electrode CG and floating gate electrode FG. Hard mask layer HM is made of a silicon nitride film, for example.

On hard mask layer HM, an antireflection film AR is arranged. Antireflection film AR is patterned and is in contact with hard mask layer HM. Antireflection film AR is made of a silicon oxynitride film (SiON), for example.

Antireflection film AR has an optical constant k value (attenuation coefficient) of more than or equal to 0.5 with respect to a wavelength of exposure light (for example, g line (436 nm) of a mercury lamp, i line (365 nm) thereof, KrF excimer laser (248 nm), ArF excimer laser (193 nm)).

First gate insulating film GI1, floating gate electrode FG, second gate insulating film GI2, control gate electrode CG, hard mask layer HM, and antireflection film AR constitute a projecting portion RA of a base layer.

Specifically, the base layer has projecting portion RA, a recessed portion RB, and a level difference ST between projecting portion RA and recessed portion RB. Projecting portion RA of the base layer is constituted by first gate insulating film GI1, floating gate electrode FG, second gate insulating film GI2, control gate electrode CG, hard mask layer HM, and antireflection film AR.

Further, recessed portion RB of the base layer is a region where these layers are not arranged. Therefore, in recessed portion RB of the base layer, for example, the main surface of semiconductor substrate SB is exposed. It should be noted that first gate insulating film GI1 may be arranged in recessed portion RB of the base layer.

Level difference ST between projecting portion RA and recessed portion RB is constituted by side wall surfaces of first gate insulating film GI1, floating gate electrode FG, second gate insulating film GI2, control gate electrode CG, hard mask layer HM, and antireflection film AR.

As shown in FIG. 2, projecting portion RA, recessed portion RB, and level difference ST of the base layer linearly extend as seen in plan view. It should be noted that plan view as used in the present specification means viewing from a direction perpendicular to a flat portion of the main surface of semiconductor substrate SB.

Next, a method for manufacturing the semiconductor device of the present embodiment will be described with reference to FIGS. 3 to 9.

As shown in FIG. 3, semiconductor substrate SB made of silicon single crystal, for example, is prepared. On the main surface of semiconductor substrate SB, first gate insulating film GI1 is formed by, for example, a thermal oxidation method or the like. On this first gate insulating film GI1, floating gate electrode FG as a film to be processed is formed by, for example, a CVD (Chemical Vapor Deposition) method or the like.

On this floating gate electrode FG, second gate insulating film GI2 is formed by, for example, the thermal oxidation method or the like. On this second gate insulating film GI2, control gate electrode CG as a film to be processed is formed by, for example, the CVD method or the like.

On this control gate electrode CG, hard mask layer HM is formed by, for example, the CVD method or the like. On this hard mask layer HM, antireflection film AR is formed by, for example, the CVD method or the like.

Onto antireflection film AR, a photoresist PR1 is applied. This photoresist PR1 is patterned by exposure to light and development. Thereby, a pattern of photoresist PR1 is formed on antireflection film AR.

As shown in FIG. 4, each of antireflection film AR and hard mask layer HM is etched, using the pattern of photoresist PR1 as a mask. Thereby, each of antireflection film AR and hard mask layer HM is patterned. Thereafter, the pattern of photoresist PR1 is removed.

Figure 5:
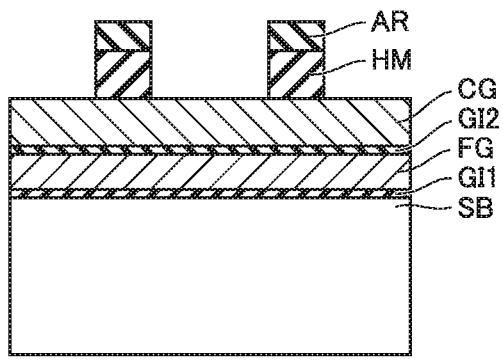
FIG. 5 is a cross sectional view schematically showing a third step of the method for manufacturing the semiconductor device in the first embodiment.

As shown in FIG. 5, an upper surface of antireflection film AR is exposed by the removal of the pattern of photoresist PR1 described above.

Figure 6:
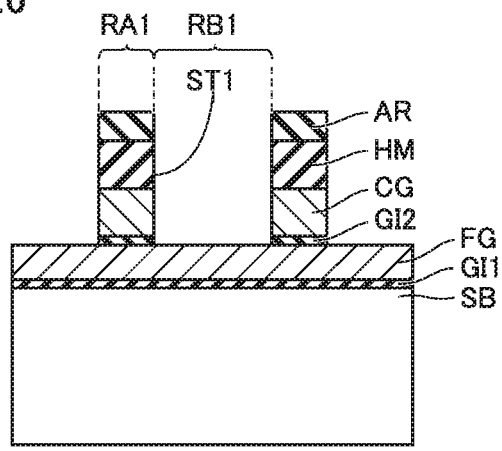
FIG. 6 is a cross sectional view schematically showing a fourth step of the method for manufacturing the semiconductor device in the first embodiment.

As shown in FIG. 6, each of control gate electrode CG and second gate insulating film GI2 is etched, using antireflection film AR as a mask. Thereby, each of control gate electrode CG and second gate insulating film GI2 is patterned. Antireflection film AR is set to have a film thickness at the time of film formation such that antireflection film AR may not be completely removed during this etching.

Thereby, the base layer having a projecting portion RA1, a recessed portion RB1, and a level difference ST1 between projecting portion RA1 and recessed portion RB1 is formed. Specifically, projecting portion RA1 of the base layer has first gate insulating film GI1, floating gate electrode FG, second gate insulating film GI2, control gate electrode CG, hard mask layer HM, and antireflection film AR.

In recessed portion RB1 of the base layer, second gate insulating film GI2, control gate electrode CG, hard mask layer HM, and antireflection film AR are removed. Therefore, projecting portion RA1 of the base layer projects upward relative to recessed portion RB1 of the base layer, by film thicknesses of second gate insulating film GI2, control gate electrode CG, hard mask layer HM, and antireflection film AR. Further, in recessed portion RB1 of the base layer, an upper surface of floating gate electrode FG is exposed.

Level difference ST1 between projecting portion RA1 and recessed portion RB1 is constituted by the side wall surfaces of second gate insulating film GI2, control gate electrode CG, hard mask layer HM, and antireflection film AR. Floating gate electrode FG and control gate electrode CG are films to be processed.

Figure 7:
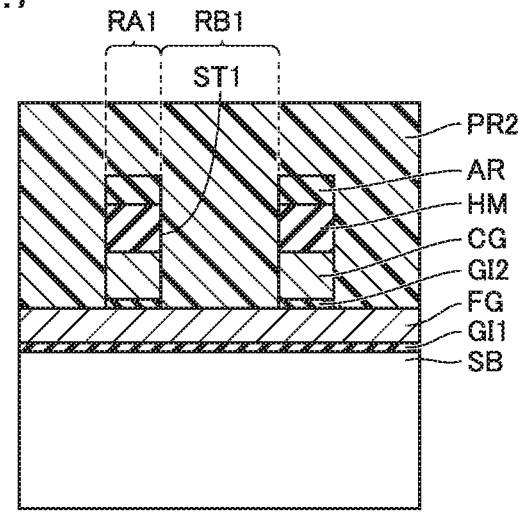
FIG. 7 is a cross sectional view schematically showing a fifth step of the method for manufacturing the semiconductor device in the first embodiment.

As shown in FIG. 7, a photoresist PR2 is formed on projecting portion RA1 and recessed portion RB1 of the base layer to cover level difference ST1. Specifically, photoresist PR2 is formed on floating gate electrode FG to cover the upper surface of antireflection film AR.

Figure 8:
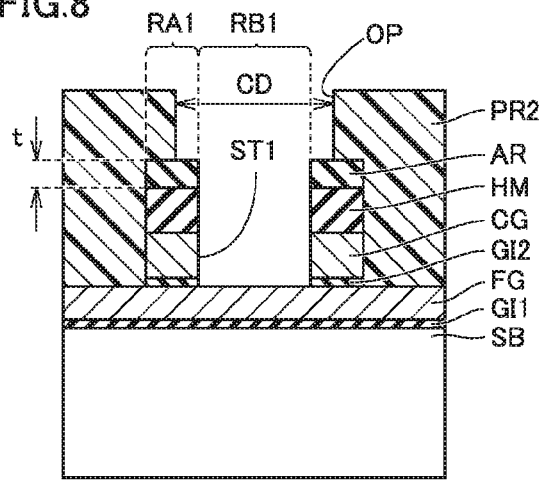
FIG. 8 is a cross sectional view schematically showing a sixth step of the method for manufacturing the semiconductor device in the first embodiment.

As shown in FIG. 8, thereafter, photoresist PR2 is patterned by exposure to light and development. Thereby, photoresist PR2 located directly above a portion of projecting portion RA1 and recessed portion RB1 is selectively removed, and a pattern of photoresist PR2 is formed.

The exposure to light described above is performed under a condition that sensitivity of a second portion of photoresist PR2 on (directly above) recessed portion RB1 is higher than sensitivity of a first portion of photoresist PR2 on (directly above) projecting portion RA1, or under a condition that, even when the sensitivity of the first portion is higher than the sensitivity of the second portion, a difference in sensitivity therebetween is as small as possible.

Specifically, the exposure to light described above is performed with antireflection film AR being located as an uppermost layer of projecting portion RA1. This antireflection film AR has an attenuation coefficient k value greater than an attenuation coefficient k value of the material for hard mask layer HM (layer HM below uppermost layer AR of projecting portion RA1) in a case where there is no antireflection film AR, with respect to a wavelength of exposure light used when exposing light to photoresist PR2.

The attenuation coefficient k value of antireflection film AR is more than or equal to 0.5 with respect to the wavelength of the exposure light used when exposing light to photoresist PR2.

Figure 9:
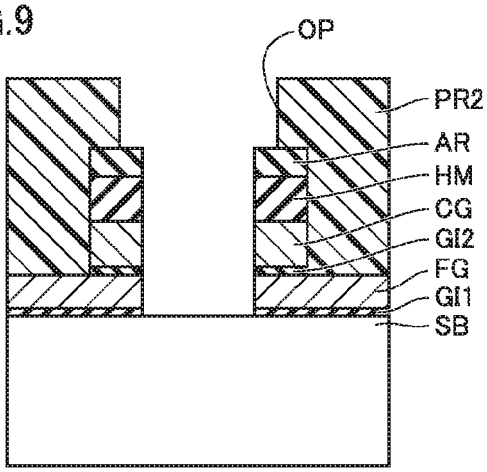
FIG. 9 is a cross sectional view schematically showing a seventh step of the method for manufacturing the semiconductor device in the first embodiment.

As shown in FIG. 9, floating gate electrode FG exposed in recessed portion RB1 and first gate insulating film GI1 therebelow are selectively removed by etching, using antireflection film AR and hard mask layer HM as a mask. Thereby, floating gate electrode FG and first gate insulating film GI1 therebelow are patterned and the main surface of semiconductor substrate SB is exposed.

Thereafter, photoresist PR2 is removed, floating gate electrode FG and first gate insulating film GI1 are further patterned by etching, and source/drain regions SD are formed by implanting an impurity into the main surface of semiconductor substrate SB. Thus, the semiconductor device shown in FIGS. 1 and 2 is manufactured.

Next, the function and effect of the present embodiment will be described as compared with a manufacturing method in a comparative example shown in FIGS. 11 to 14.

Figure 11:
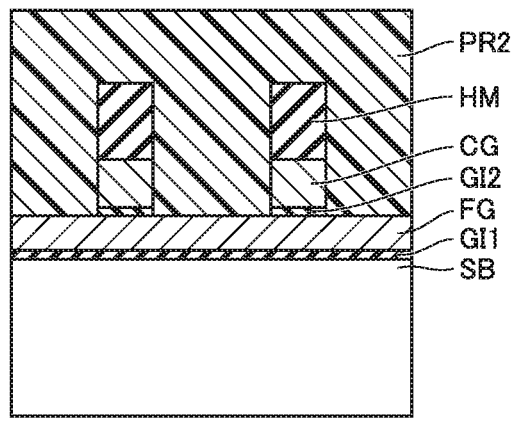
FIG. 11 is a cross sectional view schematically showing a first step of a method for manufacturing a semiconductor device in a comparative example.
Figure 12:
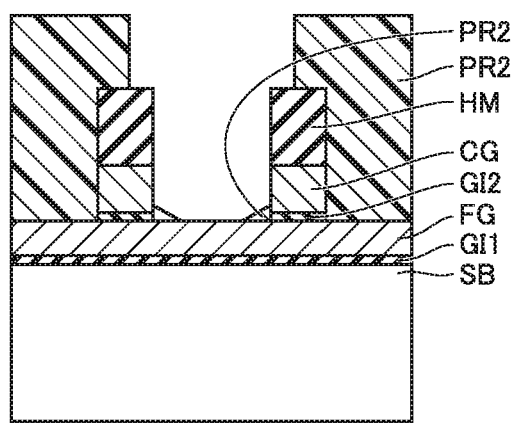
FIG. 12 is a cross sectional view schematically showing a second step of the method for manufacturing the semiconductor device in the comparative example.

As shown in FIG. 11, in the comparative example, no antireflection film is formed on hard mask layer HM. When photoresist PR2 is exposed to light and developed in this state, a residue of photoresist PR2 may be produced at a lower part of the recessed portion as shown in FIG. 12.

When the film to be processed (floating gate electrode FG) is removed by etching with this residue of photoresist PR2 being produced, the residue of photoresist PR2 functions as a mask. As a result, the film to be processed (floating gate electrode FG) located directly below the residue of photoresist PR2 remains without being removed.

Figure 13:
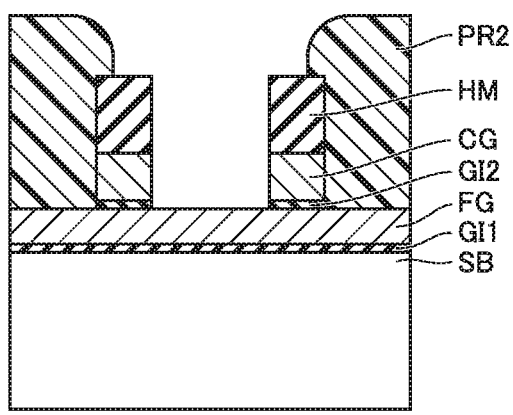
FIG. 13 is a cross sectional view schematically showing a third step of the method for manufacturing the semiconductor device in the comparative example.
Figure 14:
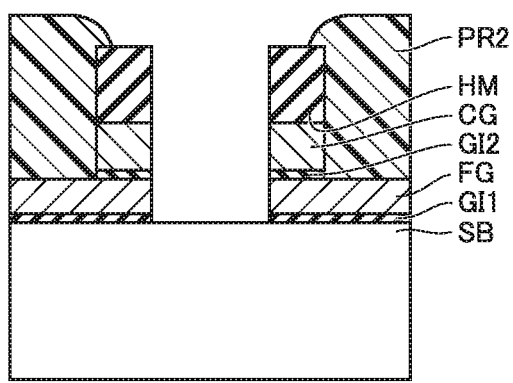
FIG. 14 is a cross sectional view schematically showing a fourth step of the method for manufacturing the semiconductor device in the comparative example.

In order to prevent this, the residue of photoresist PR2 is removed by another dry etching step as shown in FIG. 13, and thereafter the film to be processed (floating gate electrode FG) is patterned by etching.

However, the etching for removing the residue of photoresist PR2 may also cause damage to the base layer (floating gate electrode FG) or adhesion of particles to the base layer.

Thus, in order to prevent the residue of photoresist PR2 from being produced after photoresist PR2 is exposed to light and developed, it is necessary to promote melting of photoresist PR2 in recessed portion RB1 during the development, while maintaining a size CD of an opening OP in photoresist PR2 in FIG. 8 at a desired value.

In the present embodiment, photoresist PR2 is exposed to light with antireflection film AR being formed as the uppermost layer of projecting portion RA1 of the base layer and not being formed as an uppermost layer of recessed portion RB1, as shown in FIGS. 7 and 8. Thereby, photoresist PR2 can be exposed to light under the condition that the sensitivity of the second portion of photoresist PR2 on recessed portion RB1 of the base layer is higher than the sensitivity of the first portion of photoresist PR2 on projecting portion RA1 of the base layer, or under the condition that, even when the sensitivity of the first portion is higher than the sensitivity of the second portion, the difference in sensitivity therebetween is as small as possible.

That is, since incorporation of antireflection film AR reduces sensitivity of photoresist PR2 on projecting portion RA1, the amount of exposure to light for obtaining desired size CD of opening OP in photoresist PR2 can be increased. Since the amount of exposure to light can be increased, the amount of exposure to light given to recessed portion RB1 is also increased at the same time. Thus, melting of photoresist PR2 within recessed portion RB1 after the development can be promoted, preventing the residue of photoresist PR2 from being produced after the development.

Accordingly, there is no need to perform the step of removing the residue of photoresist PR2. Thus, the manufacturing process can be simplified, and damage to the base layer and adhesion of particles to the base layer, which may be caused by performing the step of removing the residue, can also be prevented.

Further, in the present embodiment, the uppermost layer (antireflection film AR) of projecting portion RA1 has the attenuation coefficient k value greater than the attenuation coefficient k value of the material for hard mask layer HM (layer HM below uppermost layer AR of projecting portion RA1) in the case where there is no antireflection film AR, with respect to the wavelength of the exposure light used when exposing light to photoresist PR2. Thereby, as described above, photoresist PR2 can be exposed to light under the condition that the sensitivity of the second portion of photoresist PR2 on recessed portion RB1 of the base layer is higher than the sensitivity of the first portion of photoresist PR2 on projecting portion RA1 of the base layer, or under the condition that, even when the sensitivity of the first portion is higher than the sensitivity of the second portion, the difference in sensitivity therebetween is as small as possible.

Further, in the present embodiment, the attenuation coefficient k value of antireflection film AR is more than or equal to 0.5 with respect to the wavelength of the exposure light used when exposing light to photoresist PR2. Thereby, reflection of the exposure light can be reduced, and the sensitivity of the second portion of photoresist PR2 on recessed portion RB1 of the base layer can be higher than the sensitivity of the first portion of photoresist PR2 on projecting portion RA1 of the base layer, or, even when the sensitivity of the first portion is higher than the sensitivity of the second portion, the difference in sensitivity therebetween can be as small as possible.

Further, in the present embodiment, in projecting portion RA1 of the base layer, hard mask layer HM is formed between the film to be processed (control gate electrode CG) and antireflection film AR. Thereby, even when antireflection film AR is removed and completely eliminated at the time of the etching of the film to be processed (floating gate electrode FG) shown in FIG. 9, hard mask layer HM serves as a mask.

Further, by forming antireflection film AR as the uppermost layer of projecting portion RA1, the sensitivity of the second portion of photoresist PR2 on recessed portion RB1 of the base layer can be higher than the sensitivity of the first portion of photoresist PR2 on projecting portion RA1 of the base layer, or, even when the sensitivity of the first portion is higher than the sensitivity of the second portion, the difference in sensitivity therebetween can be as small as possible, as described above.

Further, in the present embodiment, the step of forming the film to be processed has the steps of forming floating gate electrode FG, and forming control gate electrode CG above floating gate electrode FG. Thereby, the residue of photoresist PR2 can be prevented from being produced in the flash memory having floating gate electrode FG and control gate electrode CG.

Next, a preferable film thickness of antireflection film AR will be described with reference to FIG. 10.

Figure 10:
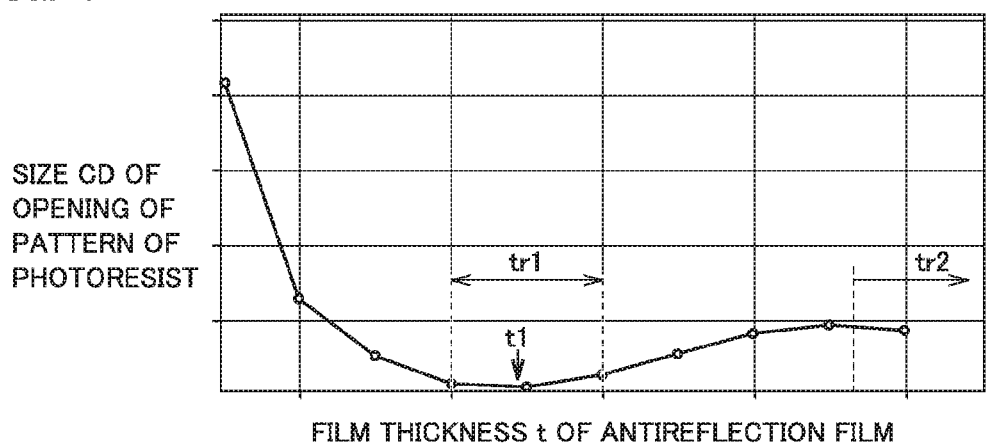
FIG. 10 is a view showing dependency of a film thickness t of an antireflection film on a size CD of an opening of a pattern of a photoresist.

FIG. 10 shows dependency of a film thickness t of antireflection film AR on size CD of opening OP of the pattern of photoresist PR2 shown in FIG. 8. Generally, as film thickness t of antireflection film AR is increased, sensitivity of photoresist PR2 is reduced, and size CD of opening OP of the pattern of photoresist PR2 reaches a minimal value t1 and thereafter converges to a constant value.

Antireflection film AR aims at reducing the sensitivity of photoresist PR2 on projecting portion RA1. Therefore, film thickness t of antireflection film AR is preferably a film thickness t1 at which size CD of opening OP is minimum in FIG. 10.

However, use of antireflection film AR is effective even when it has a film thickness other than film thickness t1 at which the sensitivity of photoresist PR2 is minimum, as long as it has an effect of reducing the sensitivity of photoresist PR2 on antireflection film AR in projecting portion RA1. Therefore, film thickness t of antireflection film AR may be in a film thickness range tr1 which is ±20% of film thickness t1 in FIG. 10.

Further, film thickness t of antireflection film AR may be in a film thickness range tr2 (FIG. 10) which is more than or equal to a film thickness at which size CD of opening OP of photoresist PR2 exhibits no change.

Next, a preferable total film thickness of hard mask layer HM and antireflection film AR will be described as compared with the comparative example shown in FIGS. 11 to 14.

In the comparative example shown in FIGS. 11 to 14, hard mask layer HM serves not only as an etching mask for control gate electrode CG and second gate insulating film GI2, but also as an etching mask for floating gate electrode FG and first gate insulating film GI1. Accordingly, hard mask layer HM should have a film thickness enough to protect control gate electrode CG even after being subjected to these etching steps.

On the other hand, in order to prevent production of the residue of photoresist PR2 shown in FIG. 12, it is desirable that hard mask layer HM has a film thickness which is as thin as possible. That is, hard mask layer HM preferably has a film thickness which allows hard mask layer HM to withstand a plurality of etching steps and is also as thin as possible.

Thus, the preferable total film thickness of hard mask layer HM and antireflection film AR in the present embodiment shown in FIGS. 3 to 9 is equal to the film thickness of hard mask layer HM in the comparative example in FIGS. 11 to 14.

Second Embodiment

In the present embodiment, by adjusting the film thickness of photoresist PR2, the sensitivity of the second portion of photoresist PR2 on recessed portion RB1 is set to be higher than the sensitivity of the first portion of photoresist PR2 on projecting portion RA1, or, even when the sensitivity of the first portion is higher than the sensitivity of the second portion, the difference in sensitivity therebetween can be set as small as possible.

Figure 15A:
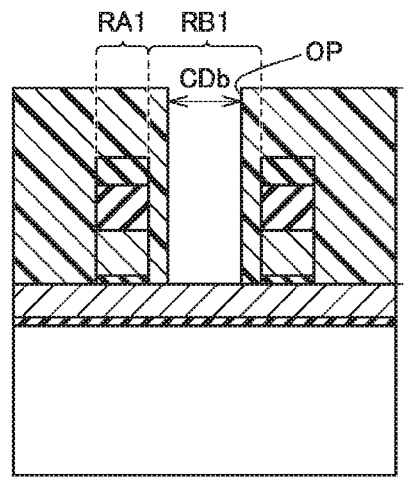
FIG. 15A is a cross sectional view showing a size CDb of an opening of a pattern of a photoresist.
Figure 15B:
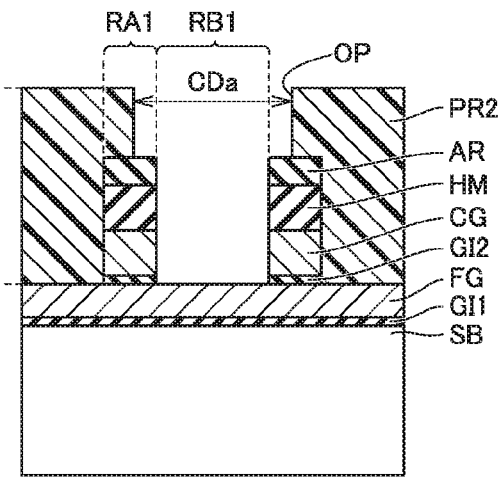
FIG. 15B is a cross sectional view showing a size CDa of an opening of a pattern of a photoresist.

As shown in FIG. 15A, CDb indicates the size of opening OP in photoresist PR2 when opening OP is intentionally limited to be only in recessed portion RB1 by underexposure to light. Further, as shown in FIG. 15B, CDa indicates the size of opening OP when photoresist PR2 is opened on a portion of projecting portion RA1 and recessed portion RB1 with an appropriate amount of exposure to light. Further, a film thickness tr of photoresist PR2 indicates a thickness from the upper surface of floating gate electrode FG to an upper surface of photoresist PR2, as shown in FIG. 15A.

Figure 16:
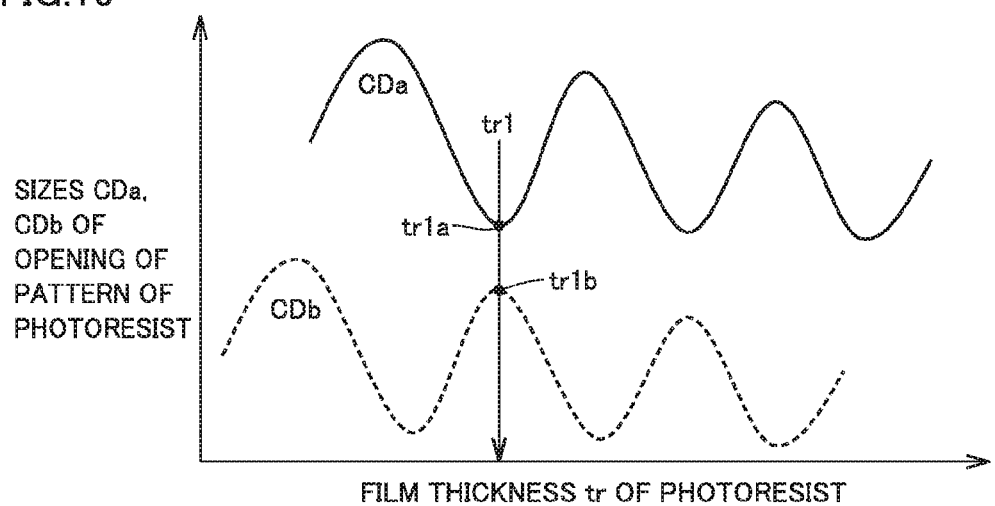
FIG. 16 is a view showing the relation between a film thickness tr of the photoresist and sizes CDa, CDb of the pattern of the photoresist.

As shown in FIG. 16, the size of opening OP in photoresist PR2 changes periodically in accordance with film thickness tr of photoresist PR2. By using this characteristic, film thickness tr of photoresist PR2 is set such that the sensitivity of photoresist PR2 on projecting portion RA1 is low and the sensitivity of photoresist PR2 on recessed portion RB1 is high.

Specifically, as shown in FIG. 16, change periods of sizes CDa and CDb are not the same as each other, due to a difference in film structure directly below opening OP between opening OP having size CDa and opening OP having size CDb. Therefore, film thickness tr of photoresist PR2 can be set to a film thickness at which size CDa has a minimal value (i.e., sensitivity has a minimal value) and size CDb has a maximal value (i.e., sensitivity has a maximal value), such as at a film thickness tr1 in FIG. 16.

However, the minimal value of size CDa and the maximal value of size CDb do not need to be completely aligned at the same film thickness tr. Film thickness tr1 of the photoresist on recessed portion RB1 only needs to be set such that a film thickness tr1$a$ of photoresist PR2 on recessed portion RB1 at which the sensitivity of photoresist PR2 on projecting portion RA1 has a minimal value, and a film thickness tr1$b$ of photoresist PR2 on recessed portion RB1 at which the sensitivity of photoresist PR2 on recessed portion RB1 has a maximal value are included within a range which is ±10% of film thickness tr1. Thereby, the minimal value of size CDa and the maximal value of size CDb can be brought close to each other, and a difference in sensitivity between the sensitivity of photoresist PR2 on projecting portion RA1 and the sensitivity of photoresist PR2 on recessed portion RB1 can be fully widened.

Further, film thickness tr1 of photoresist PR2 shown in FIG. 16 may be combined with the configuration of the first embodiment provided with antireflection film AR, as shown in FIGS. 15A and 15B.

Further, film thickness tr1 of photoresist PR2 shown in FIG. 16 may be combined with a configuration in which only hard mask layer HM is formed on the film to be processed (control gate electrode CG) as in the comparative example shown in FIGS. 11 to 14.

It should be noted that, of the components of the present embodiment shown in FIGS. 15A and 15B, components other than those described above are substantially identical to those in the first embodiment. Therefore, identical elements are designated by the same reference characters, and the description thereof is not repeated.

Third Embodiment

Figure 17:
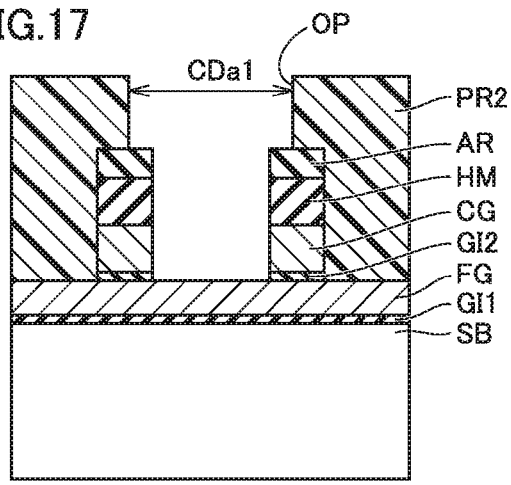
FIG. 17 is a cross sectional view showing a size CDa1 of an opening of a pattern of a photoresist.

As shown in FIG. 17, in the present embodiment, antireflection film AR made of a silicon oxynitride film is formed to have an attenuation coefficient k value different from the attenuation coefficient k value of antireflection film AR in the first embodiment. The attenuation coefficient k value of antireflection film AR can be changed for example by changing the flow rate of process gas SiH$_4$ during formation of the silicon oxynitride film.

A size CDa1 of opening OP formed in photoresist PR2 can be changed by changing the attenuation coefficient k value of antireflection film AR in the configuration of FIG. 17.

Figure 18:
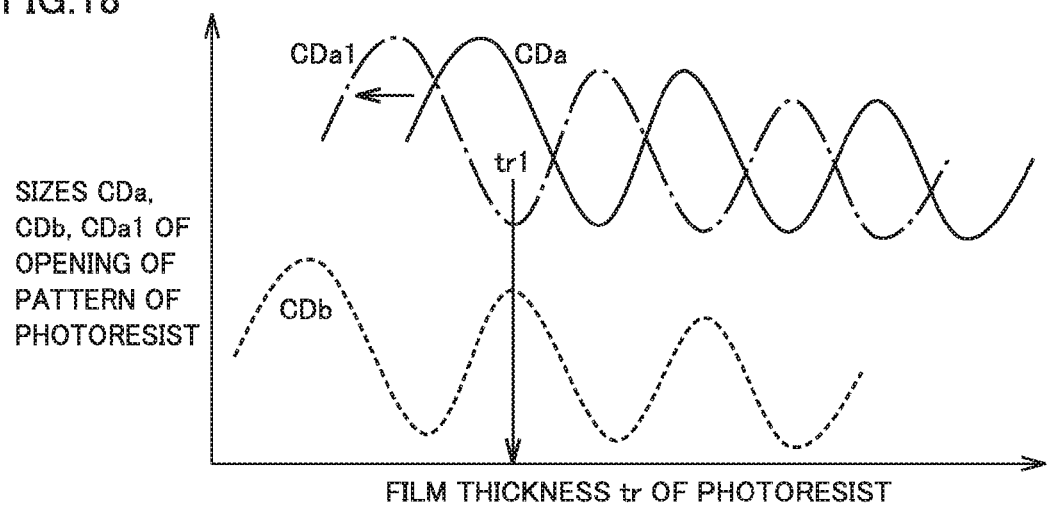
FIG. 18 is a view showing the relation between film thickness tr of the photoresist and sizes CDa, CDb, CDa1 of the pattern of the photoresist.

As shown in FIG. 18, the change period of size CDa indicated by a solid line can be shifted in an axial direction of film thickness tr, like a change period of size CDa1 indicated by a dashed-dotted line, by changing a refractive index n value and the attenuation coefficient k value of antireflection film AR. Therefore, by appropriately setting the attenuation coefficient k value of antireflection film AR, a minimal value of size CDa1 and the maximal value of size CDb can be aligned at the same film thickness tr1.

Thereby, the difference in sensitivity between the sensitivity of photoresist PR2 on projecting portion RA1 and the sensitivity of photoresist PR2 on recessed portion RB1 can be widened to a maximum extent.

Further, in the present embodiment described above, in the configuration in which only hard mask layer HM is formed on the film to be processed (control gate electrode CG) as in the comparative example shown in FIGS. 11 to 14, a refractive index n value and an attenuation coefficient k value of hard mask layer HM may be changed. Change of the refractive index n value and the attenuation coefficient k value of hard mask layer HM may be performed by means of a film formation method for hard mask layer HM, change of the material therefor, and a combination thereof.

It should be noted that, of the components of the present embodiment shown in FIG. 17, components other than those described above are substantially identical to those in the first embodiment. Therefore, identical elements are designated by the same reference characters, and the description thereof is not repeated.

Further, although each of the first to third embodiments has described a configuration in which hard mask layer HM is formed in contact with control gate electrode CG, another layer may be arranged between control gate electrode CG and hard mask layer HM.

Further, although each of the first to third embodiments has described a configuration of the memory cells of the flash memory, each of the first to third embodiments may be applied to another configuration having a projecting portion and a recessed portion having a level difference therebetween.

Although the invention made by the present inventor has been specifically described based on the embodiments, it is needless to say that the present invention is not limited to the embodiments and can be modified variously within the scope not departing from the gist thereof.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device, comprising:
    forming a base layer having a projecting portion, a recessed portion, and a level difference between the projecting portion and the recessed portion;
    forming a photoresist on the projecting portion and the recessed portion of the base layer to cover the level difference; and
    exposing light to the photoresist under a condition that sensitivity of a second portion of the photoresist on the recessed portion is higher than sensitivity of a first portion of the photoresist on the projecting portion;
    wherein an uppermost layer of the projecting portion is an antireflection film having an attenuation coefficient k value greater than an attenuation coefficient k value of a layer below the uppermost layer of the projecting portion, with respect to a wavelength of exposure light used when exposing light to the photoresist;
    wherein the projecting portion of the base layer is formed to include a film to be processed, and a hard mask layer made of a material different from a material for the film to be processed, and
    wherein the hard mask layer is formed between the film to be processed and the antireflection film.

2. The method for manufacturing the semiconductor device according to claim 1, wherein the attenuation coefficient k value of the antireflection film is more than or equal to 0.5 with respect to the wavelength of the exposure light used when exposing light to the photoresist.

3. The method for manufacturing the semiconductor device according to claim 1, wherein forming the film to be processed comprises:
    forming a floating gate electrode, and
    forming a control gate electrode above the floating gate electrode.

4. A method for manufacturing a semiconductor device, comprising:
    forming a base layer having a projecting portion, a recessed portion, and a level difference between the projecting portion and the recessed portion;

forming a photoresist on the projecting portion and the recessed portion of the base layer to cover the level difference; and exposing light to the photoresist under a condition that sensitivity of a second portion of the photoresist on the recessed portion is higher than sensitivity of a first portion of the photoresist on the projecting portion, wherein a film thickness of the photoresist on the recessed portion is set such that a film thickness of the photoresist on the recessed portion at which sensitivity of the photoresist on the projecting portion has a minimal value, and a film thickness of the photoresist on the recessed portion at which sensitivity of the photoresist on the recessed portion has a maximal value are included within a range which is ±10% of the film thickness of the photoresist on the recessed portion.

\* \* \* \* \*